United States Patent
Casto et al.

(10) Patent No.: US 10,602,628 B2
(45) Date of Patent: Mar. 24, 2020

(54) ENCLOSURE WITH ONE-PIECE STRUCTURAL FRAME

(71) Applicant: AmpThink, LLC, Garland, TX (US)

(72) Inventors: Dion Joe Casto, Nevada, TX (US); William C. Anderson, III, Garland, TX (US)

(73) Assignee: AmpThink, LLC, Garland, TX (US)

( * ) Notice: Subject to any disclaimer, the term of this patent is extended or adjusted under 35 U.S.C. 154(b) by 0 days.

(21) Appl. No.: 16/365,274

(22) Filed: Mar. 26, 2019

(65) Prior Publication Data

US 2019/0289730 A1     Sep. 19, 2019

Related U.S. Application Data

(63) Continuation-in-part of application No. 15/498,387, filed on Apr. 26, 2017, now Pat. No. 10,244,649.

(51) Int. Cl.
| | |
|---|---|
| *H05K 7/02* | (2006.01) |
| *H05K 7/04* | (2006.01) |
| *H05K 5/02* | (2006.01) |
| *H05K 5/06* | (2006.01) |
| *H05K 5/00* | (2006.01) |

(52) U.S. Cl.
CPC ......... *H05K 5/0217* (2013.01); *H05K 5/0004* (2013.01); *H05K 5/061* (2013.01)

(58) Field of Classification Search
USPC .................................. 361/752, 809
See application file for complete search history.

(56) References Cited

U.S. PATENT DOCUMENTS

| | | | | |
|---|---|---|---|---|
| 3,129,942 A | * | 4/1964 | Calverley | A63F 3/00895 273/287 |
| 4,854,476 A | * | 8/1989 | Serio, Jr. | B65D 53/02 220/4.01 |
| 7,245,497 B2 | * | 7/2007 | Klein | H05K 5/0021 361/752 |
| 9,287,032 B1 | * | 3/2016 | Zweifel | H01F 27/02 |

\* cited by examiner

*Primary Examiner* — Hung S. Bui
(74) *Attorney, Agent, or Firm* — AmpThink, LLC; James R. Banowsky

(57) ABSTRACT

A one-piece structural frame for use with an enclosure, such as an enclosure that houses one or more electronic components is described. The one-piece structural frame includes cutouts that enable the frame to be deformed into a shape conforming to an enclosure to provide additional structural support for the enclosure. The techniques described herein provide a lighter, less expensive method for creating an enclosure frame and for ease in manufacturing the frame and an enclosure that includes the frames.

10 Claims, 8 Drawing Sheets

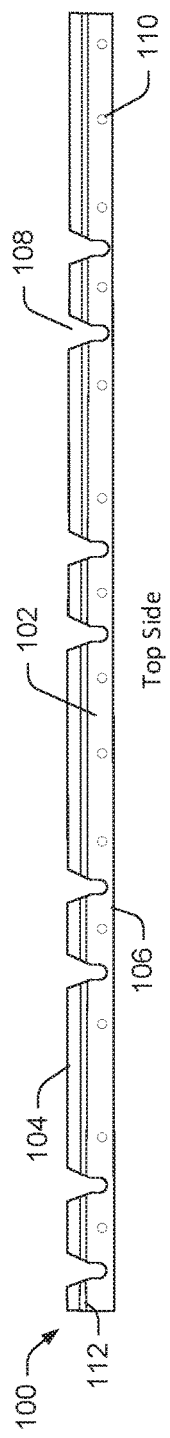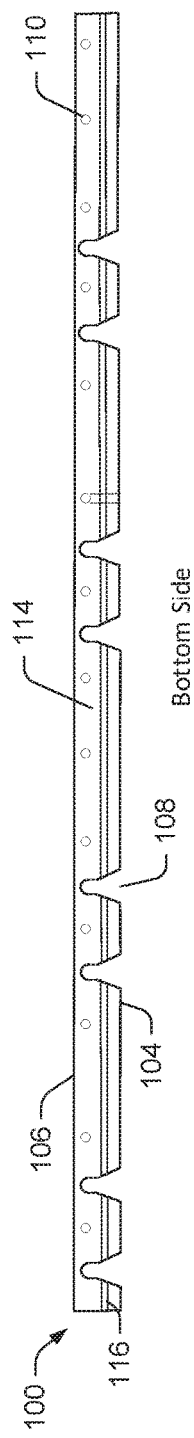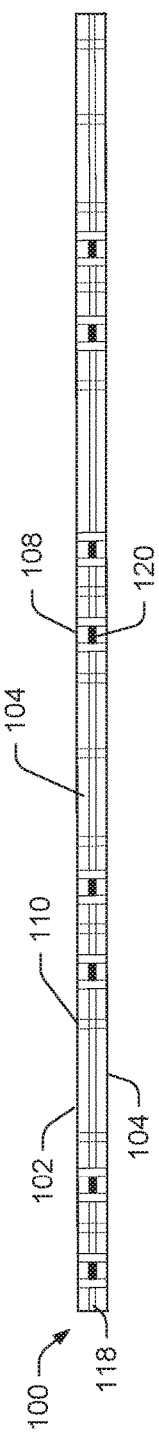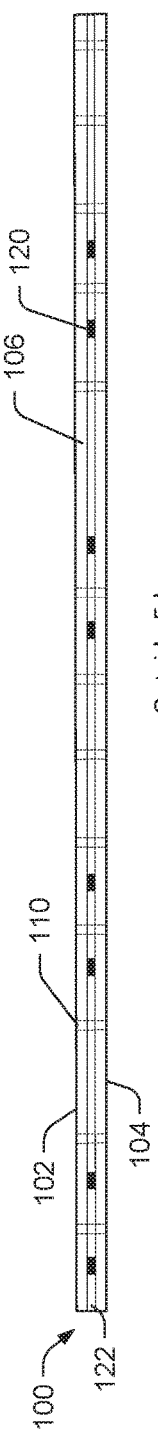

ENCLOSURE WITH ONE-PIECE STRUCTURAL FRAME

CROSS-REFERENCE TO RELATED APPLICATION

This application is a continuation-in-part of and claims the benefit of U.S. patent application Ser. No. 15/498,387, entitled "Enclosure for Electronic Components," filed on Apr. 26, 2017, which is hereby incorporated by reference for all purposes.

BACKGROUND

Enclosures, also known as housings, are commonly used to hold and secure electronic components that are sensitive to environmental forces, including moisture, physical impact, dust, debris, etc. As such, it is important that such enclosures provide protection against such forces that can adversely affect the components. Such enclosures are typically made from a flexible material, such as plastic, that can be deformed upon installation or over time, after exposure to outdoor elements, such as rain, sleet, snow, wind, excessively hot or cold temperatures, etc. Whether outdoors or indoors, such enclosures are often exposed to human activity, which often results in physical contact and catastrophic shock to components contained therein if the enclosure does not have sufficient protection against deformation.

SUMMARY

Systems, methods, and articles of manufacture are disclosed herein that relate to a one-piece structural frame, manufacture thereof, and use thereof in an enclosure designed to house electronic components. In various embodiments, enclosures are described that include a one-piece structural frame that provides structural support for the enclosures and protects against structural deformation. The one-piece structural frame is configured in such a way as to facilitate installation in an enclosure so that manufacture of a completed enclosure and frame is more efficient than current methods of manufacture.

BRIEF DESCRIPTION OF THE DRAWINGS

A particular description of the principles briefly described above will be rendered by reference to specific embodiments thereof, which are illustrated in the appended drawings. Understanding that these drawings depict only certain exemplary embodiments of the disclosure and are not therefore to be considered to limit its scope, the principles herein are described and explained with additional specificity and detail through the use of the accompanying drawings.

FIG. 1A is a top side view of an example frame in accordance with the present description.

FIG. 1B is a bottom side view of an example frame in accordance with the present description.

FIG. 1C is an inside edge view of an example frame in accordance with the present description.

FIG. 1D is an outside edge view of an example frame in accordance with the present description.

DETAILED DESCRIPTION

Figure 2A:
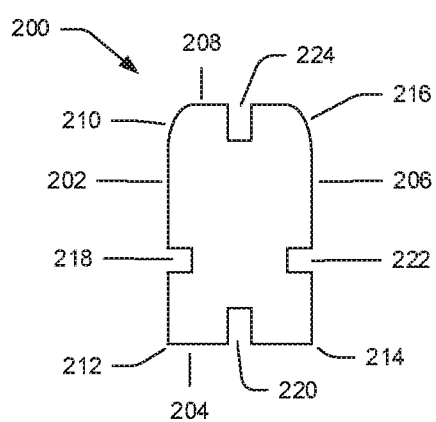
FIG. 2A is a cross-section view of an example frame in accordance with the present description.
Figure 2B:
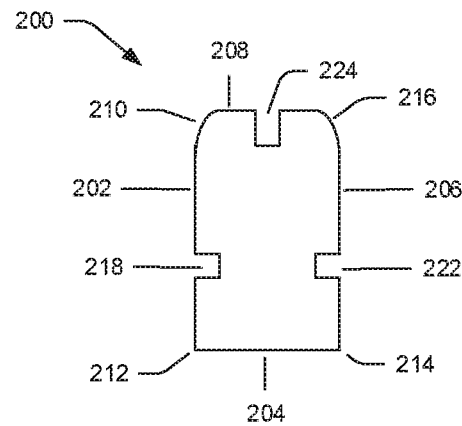
FIG. 2B is a cross-section view of an example frame in accordance with the present description.

Systems, methods, and articles of manufacture are disclosed herein that relate to a one-piece structural frame, manufacture thereof, and use thereof in an enclosure designed to house electronic components. In various embodiments, enclosures are described that include a one-piece structural frame that provides structural support for the enclosures and protects against structural deformation. The one-piece structural frame is configured in such a way as to facilitate installation in an enclosure so that manufacture of a completed enclosure and frame is more efficient than current methods of manufacture. The present description provides discussion and examples in the particular context of an enclosure for electronic components. However, describing the techniques herein in such a context is not intended to limit application of the techniques to other contexts.

Many enclosures for electronic components are made from plastic, which has a characteristic of being deformable, meaning that an enclosure made from plastic may be easily deformed from its original position. Such deformation is problematic in that when a plastic enclosure is deformed, it is unlikely that a proper seal will be made between two parts of the enclosure. This is true whether two parts of an enclosure are connected by way of a hinge or if the two parts are separate parts that are sealed using connectors. Excessive heat or cold can act to deform a plastic enclosure, as can physical contact between a person or entity and the enclosure. When a part of an enclosure is deformed to an extent where a seal cannot be made between parts of the enclosure, environmental factors such as rain, ice, wind, moisture, etc., can enter the enclosure and cause catastrophic failure of electronic components disposed within the enclosure. Therefore, it is desirable to limit deformation of an enclosure so as to better protect components disposed inside the enclosure.

The techniques described herein relate to a semi-rigid one-piece structural frame—typically made from metal—that is used in an enclosure assembly so as to provide increased structural integrity to the enclosure, thus providing protection from external elements to components disposed inside the enclosure. As described in greater detail below, the frame contemplated in the present techniques may be extruded from a single piece of metal, thus allowing for efficiency in its manufacture. With respect to frames that are comprised of more than one piece, the one-piece frame shown herein only has a single connection point, which provides for manufacturing efficiencies. Such a one-piece frame uses less material than a typical frame and is, therefore, lighter weight. In addition, the process of integrating a one-piece from with an enclosure allows room for error in the manufacturing process, as higher deviations may be tolerated due to certain characteristics of the described frame. These and other features and advantages of the one-piece structural frame and component enclosures made therewith will be described in greater detail, below, with respect to the attached drawings.

FIGS. 1A-1D illustrate an example frame 100 in accordance with the present description. FIG. 1A is a view of a top side 102 of the example frame 100. In addition to the top side, the example frame 100 includes an inside edge 104 and an opposing outside edge 106. The example frame 100 also includes multiple cutouts 108 and multiple fastener holes 110. Each fastener hole 110 provides for reception of a fastener (not shown) to fasten the example frame 100 to a part of an enclosure (not shown). The example frame 100 shown in FIGS. 1A-1D also include a top gasket channel 112 that may receive a top gasket (not shown) in at least part of the top gasket channel 112. Although some embodiments may not include a top gasket or the top gasket channel 112, one or more embodiments may use a top gasket disposed in the top gasket channel 112 to improve a seal between a first portion of an enclosure and a second portion of an enclosure and or a seal between the frame 100 and a portion of an enclosure.

FIG. 1B depicts a view of a bottom side 114 of the example frame 100, showing the inside edge 104, the outside edge 106, the cutouts 108, the fastener holes 110 shown and described with respect to FIG. 1A. In addition, the frame 100 is shown having a bottom gasket channel 116 that may receive a bottom gasket (not shown). Although the bottom gasket channel 116 and a bottom gasket disposed therein may not be utilized in all embodiments, in one or more embodiments, a bottom gasket may be disposed in the bottom gasket channel 116 to improve a seal between a first portion of an enclosure and a second portion of an enclosure and/or a seal between the frame 100 and a portion of an enclosure.

FIG. 1C depicts a view of the inside edge 104 of the example frame 100. In addition to the foregoing, the example frame 100 also includes an inside channel 118. As described in greater detail below, the inside channel 118 may work in conjunction with a component bracket (not shown) so that the component bracket may slide to different positions within the inside channel 118 and, hence, an enclosure. It is noted that in at least one embodiment, the inside channel 118 is not formed in the example frame 100, such as when additional elements that utilize the inside channel 118 are not implemented. The view in FIG. 1C also shows multiple voids 120 that are formed in the outside edge 106 of the example frame 100, each void 120 corresponding with a location of a cutout 108. The voids 120 provide flexibility to bend the example frame 100 at the point of each cutout 108.

FIG. 1D depicts a view of the outside edge 106 of the example frame 100. In addition to showing elements previously described, FIG. 1D shows that the example frame 100 also includes an outside channel 122. The outside channel 122, though not used in all possible embodiments, may be used to provide a receptacle for a frame connector (not shown) as described in greater detail below. Furthermore, the outside channel 122 may be used to decrease the weight of the example frame 100 even in the absence of the use of a connector.

Figure 2C:
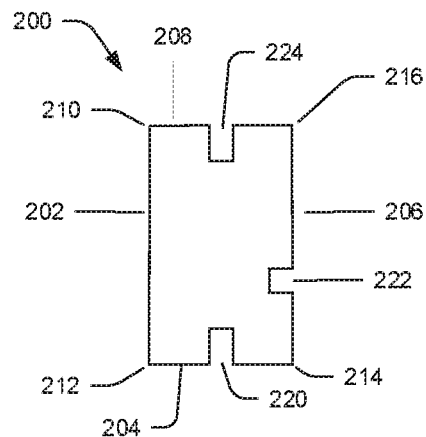
FIG. 2C is a cross-section view of an example frame in accordance with the present description.
Figure 2D:
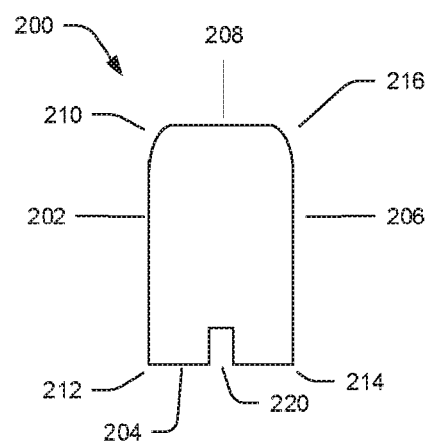
FIG. 2D is a cross-section view of an example frame in accordance with the present description.

FIGS. 2A-2D depict cross-section views of different embodiments of an example frame 200 in accordance with the present description. Each unique embodiment includes different combinations of channels and different shapes due to the presence or absence of chamfered corners. The example frame 200 includes a top side 202, an outside edge 204, a bottom side 206, and an inside edge 208. A first corner 210 is formed between the top side 202 and the inside edge 208. A second corner 212 is formed between the top side 202 and the outside edge 204. A third corner 214 is formed between the outside edge 204 and the bottom side 206. A fourth corner 216 is formed between the bottom side 206 and the inside edge 208. As shown in FIG. 2A, the first corner 210 and the fourth corner 216 are chamfered, while the second corner 212 and the third corner 214 are not. As shown in FIG. 2C, none of the corners (210, 212, 214, 216) are chamfered. Chamfered corners may be used when desired to decrease weight of the example frame 200 and/or to provide a more desirable experience during installation of the example frame 200 into an enclosure.

The example frame 200 also includes a top gasket channel 218, an outside channel 220, a bottom gasket channel 220, and an inside channel 222. Various embodiments may include different combinations of the channels 218-222, depending on the needs of a particular embodiment. For example, the embodiment of the example frame 200 shown in FIG. 2A includes all the channels 218-222 while the embodiment of the example frame shown in FIG. 2D only includes the outside edge channel 220. Different embodiments may include from zero to all four of the channel 218-222 depending on the functionality anticipated for the example frame 200. Channels may be used for functional purposes described herein or may be included to decrease an amount of material used to manufacture the frame 200 for cost or weight purposes.

Figure 3A:
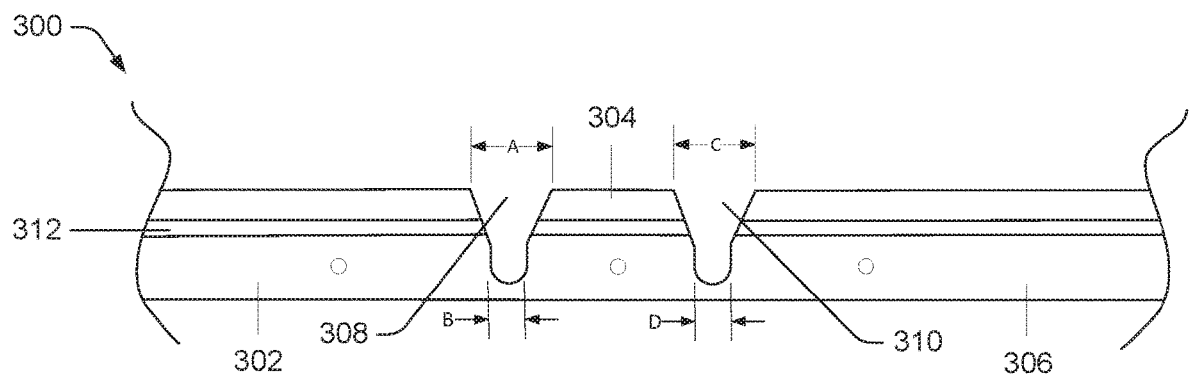
FIG. 3A is a top side view of an example frame in an original position in accordance with the present description.
Figure 3B:
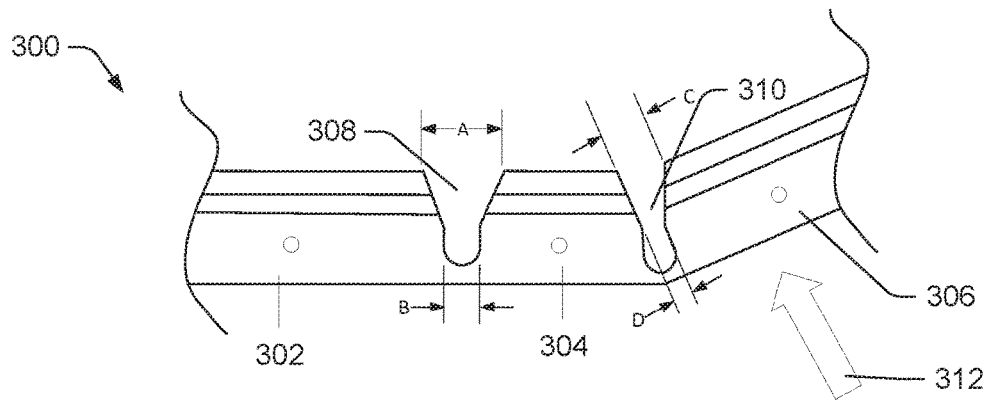
FIG. 3B is a top side view of an example frame in an intermediate position in accordance with the present description.
Figure 3C:
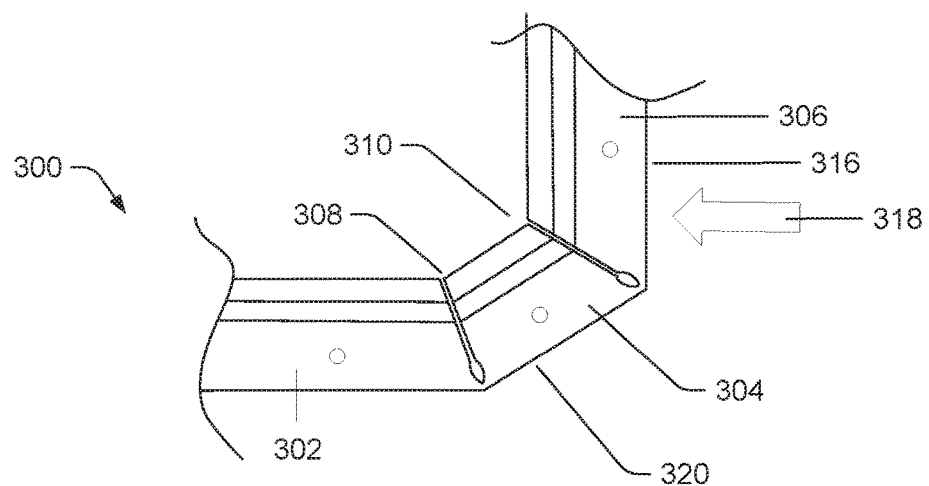
FIG. 3C is a top side view of an example frame in a final position in accordance with the present description.

FIGS. 3A-3C depict a section of an example frame 300 similar to the example frame 100 shown in FIGS. 1A-1D. FIG. 3A depicts the example frame 300 in an original position. FIG. 3B depicts the example frame 300 in an intermediate position. FIG. 3C depicts the example frame 300 in a final position. The progression of the positions of the example frame 300 show how the example frame 300 is transformed from a linear configuration as manufactured into a configuration having corners that enable the example frame 300 to be conjoined with an enclosure (not shown). Such a transformation allows the example frame to be manufactured and installed as a one-piece unit rather than having one or more sections to be connected in a manufacturing process.

Referencing FIG. 3A, the example frame 300 includes a first top section 302, a second top section 304, and a third top section 306. The example frame also includes a first cutout 308, a second cutout 310, and a top gasket channel 312 that spans a length of the top sections 302, 304, 306. It is noted that in at least one embodiment, the top gasket channel 312 is not present. The first cutout 308 includes a first span A and a second span B. The second cutout 310 includes a first span C and a second span D.

Referencing FIG. 3B, the example frame 300 is shown having a force applied in a direction of arrow 314, i.e., a direction perpendicular to an outside edge 316 of the example frame 300. As the force is applied, the third top section 306 moves in the direction of arrow 314, which causes the first span C of the second cutout 310 and the second span D of the second cutout 310 to decrease. Referencing FIG. 3C, the example frame 300 is shown after the force indicated by arrow 318 continues to be applied. As shown, the force is applied until the first span C of the second cutout 310 and the second span D of the second cutout 310 are decreased to almost zero. Furthermore, the application of the force indicated by arrow 318 causes the first span A of the first cutout 308 and the second span B of the first cutout 308 to be decreased to almost zero. When the example frame 300 reaches this state, a frame corner 320 is created. As described in greater detail below, the frame corner 320 matches a corner of an enclosure with which the frame will be mated.

The number of cutouts and spacing between cutouts are determined by the shape of an enclosure in which the frame is to be disposed. For every side of a frame, there must be two cutouts that are deformable to create an angled corner between adjacent sides. A desired angle measure between two sides determines the shape of the cutouts that are deformed to create a corner between the two sides.

Figure 4:
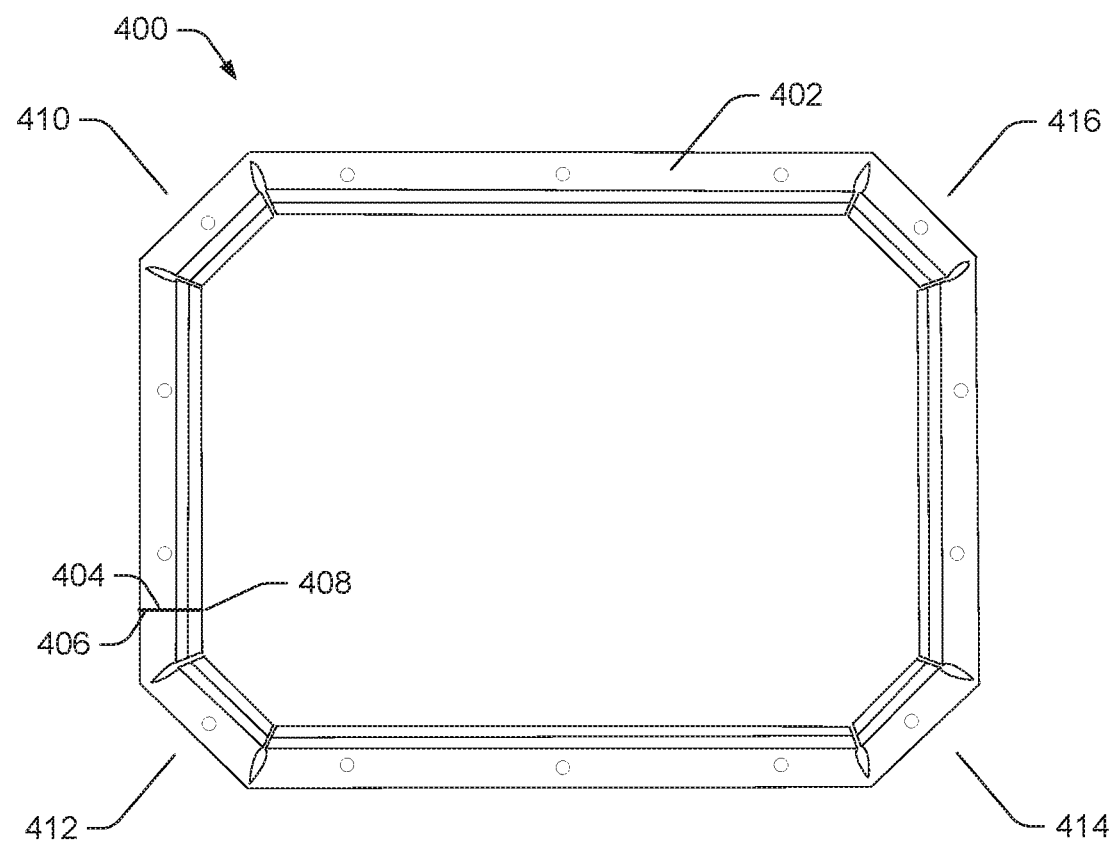
FIG. 4 is a top side view of an example frame in accordance with the present description.

FIG. 4 is a top view of an example frame 400 similar to the example frame 100 (FIG. 1) in a completed state. The example frame 400 includes a top side 402, a first end 404, and a second end 406. The first end 404 and the second end 406 abut to create a seam 408. The example frame also includes a first corner 410, a second corner 412, a third corner 414, and a fourth corner 416 that were formed in the manner shown and described with respect to FIGS. 3A-3C. As described in greater detail below, the example frame 400 is configured to attain a shape similar to a shape of an enclosure so that the example frame 400 will communicate properly with the enclosure.

Figure 5A:
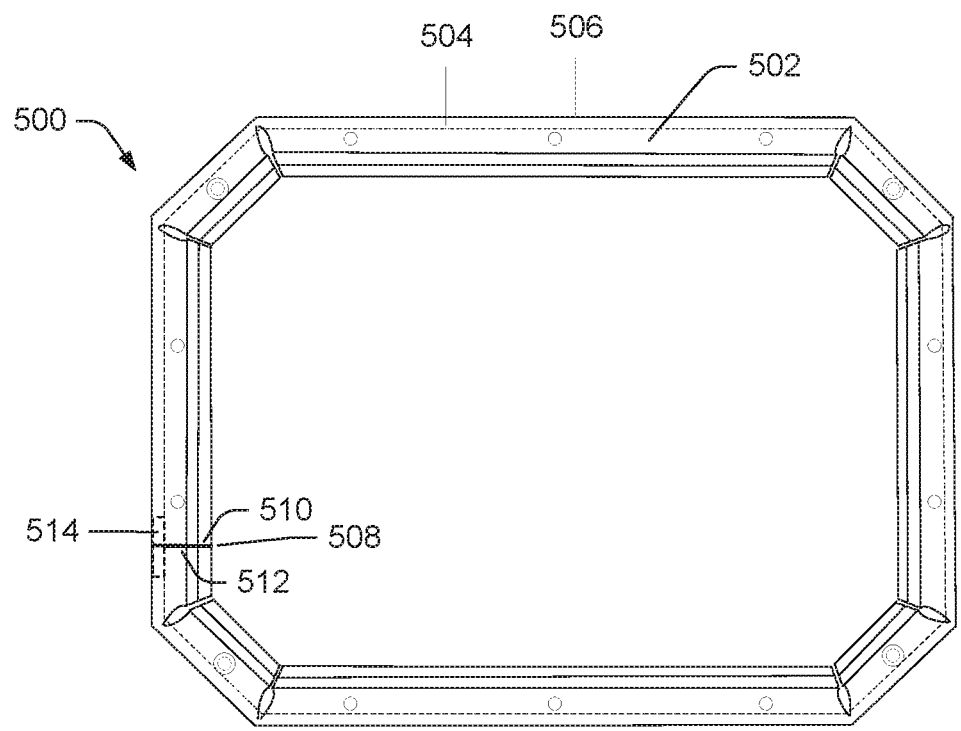
FIG. 5A is a top side view of an example frame with a connecting member in accordance with the present description.

FIG. 5A is a top view of an example frame 500 similar to the example frame 400 shown in FIG. 4. The example frame 500 includes a top side 502 and an outside channel 504 formed into an outside edge 506. A seam 508 is formed where a first end 510 and a second end 512 of the example frame 500 meet. A connector 514 is disposed in the outside channel 504 and spans the seam 508. The connector 514 may or may not be utilized in various implementations. If present, the connector 514 provides additional stability to the completed example frame 500.

Figure 5B:
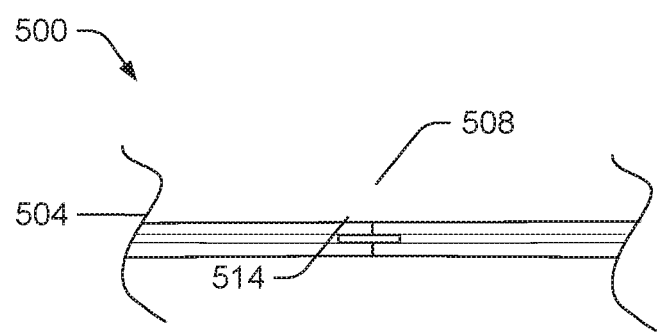
FIG. 5B is an outside edge view of the example frame with a connecting member shown in FIG. 5B.

FIG. 5B is a view of a section of the outside edge 506 of the example frame 500 showing the connector 514 disposed within the outside channel 504 of the example frame 500. As previously noted, the connector 514 spans the seam 508 to provide additional stability to the example frame 500. Although the connector 514 is shown of a certain length, it is noted that the connector 514 may be of any practicable length for a particular embodiment. The connector 514 may be made of any suitable material, such as metal, plastic, wood, etc.

Figure 6A:
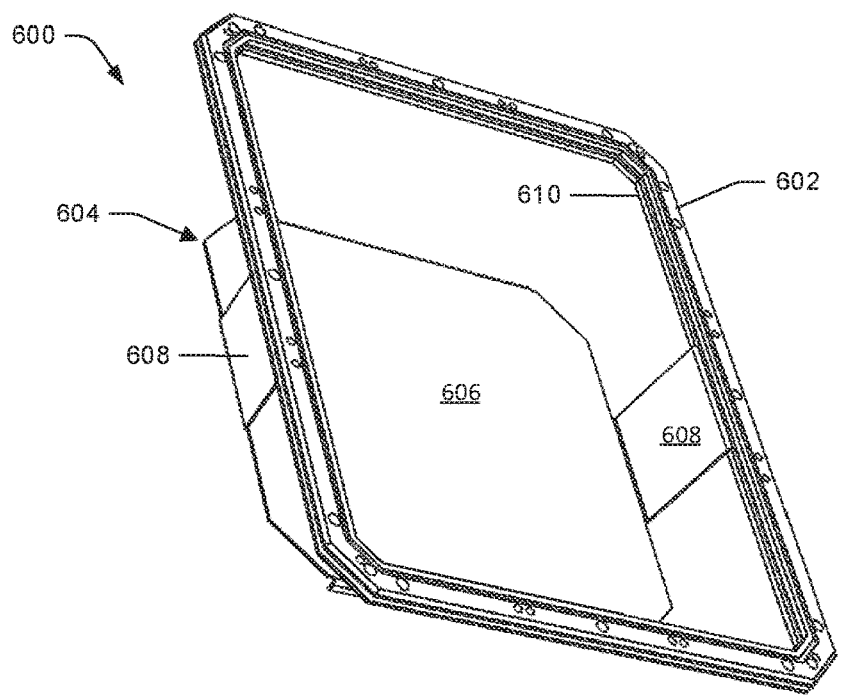
FIG. 6A is a depiction of an example frame and bracket assembly constructed in accordance with the present description.
Figure 6B:
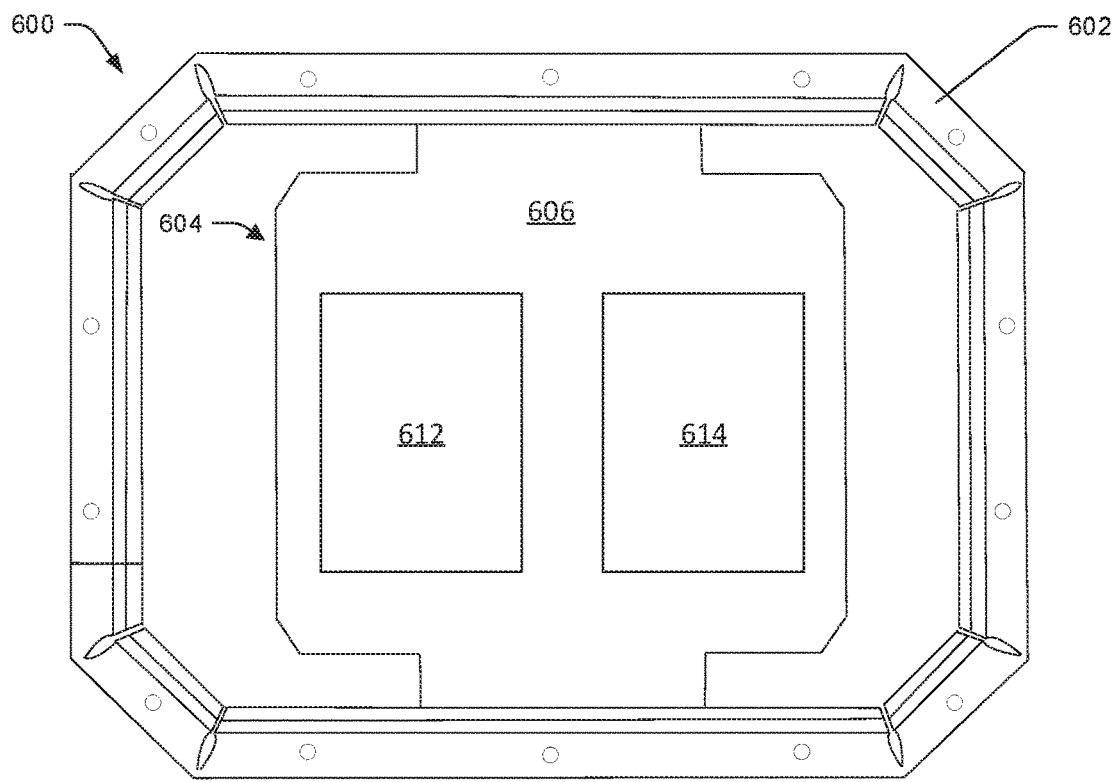
FIG. 6B is a depiction of example frame and bracket assembly constructed in accordance with the present description.

FIG. 6A depicts an example frame and bracket assembly 600 that includes a one-piece structural frame 602 and an electronic component bracket 604. The electronic component bracket 604 includes a body 606 and multiple flanges 608. The frame 602 includes an inside channel 610 similar to frames shown in previous figures. The flanges 608 are disposed inside the inside channel 610 such that the component bracket 604 can be positioned at different locations relative to the frame 602 by sliding the flanges 608 along a length of the inside channel 610. FIG. 6B depicts the example bracket assembly 600 shown in FIG. 6A showing a first electronic component 612 and second electronic component 614 disposed on the body 606 of the component bracket 604.

Figure 7:
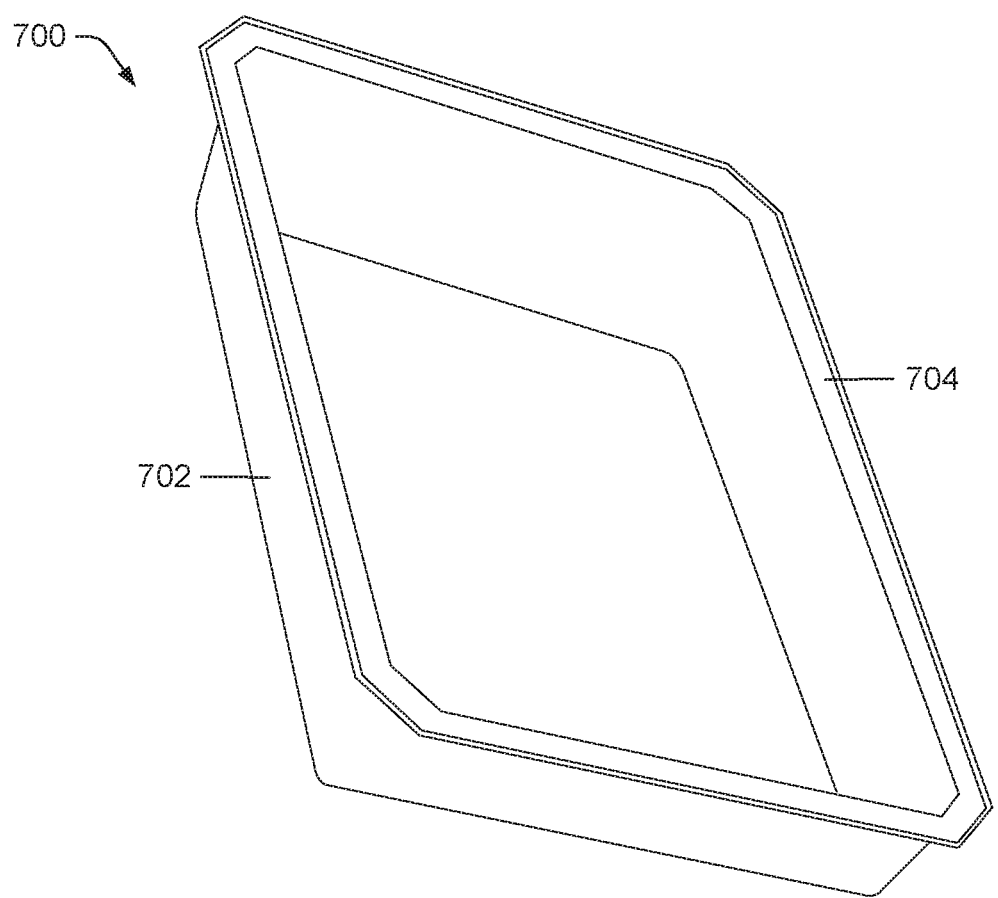
FIG. 7 is a depiction of an example electronic component enclosure bottom in accordance with the present description, in which the example electronic component bracket and frame shown in FIG. 6A may be installed.

FIG. 7 is a depiction of an example enclosure bottom 700 in accordance with the present description, in which the example frame and bracket assembly shown in FIG. 6 may be installed. The example enclosure bottom 700 includes a body 702 and a flange 704 configured to receive a one-piece structural frame as described above. The flange 704 is of an approximate size and shape of a completed frame so that a completed frame fits into the flange.

Figure 8A:
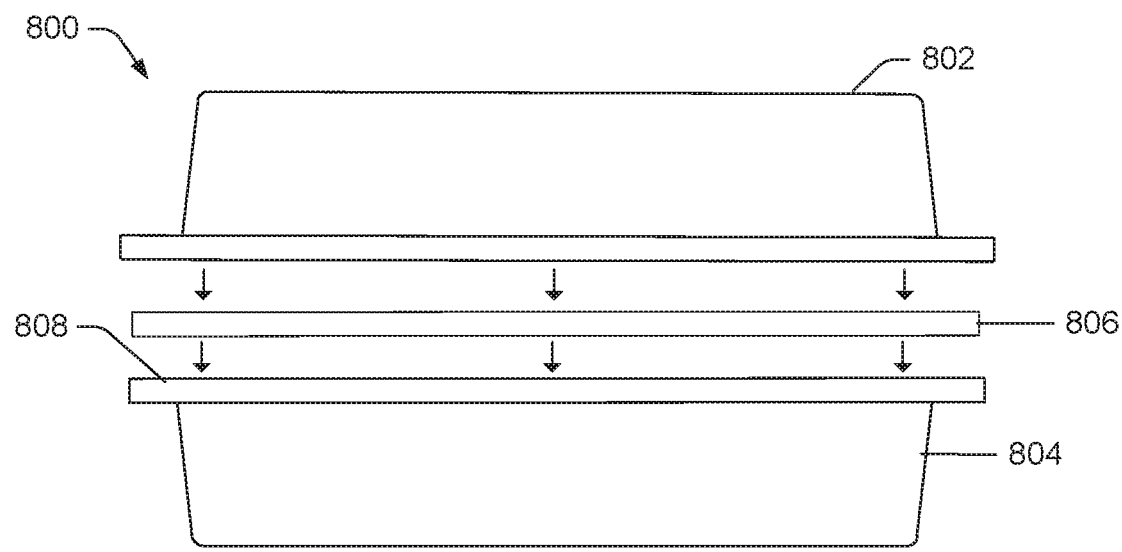
FIG. 8A is a depiction of an example electronic component enclosure in accordance with the present description, showing how a one-piece structural frame may be situated between an enclosure top and an enclosure bottom.
Figure 8B:
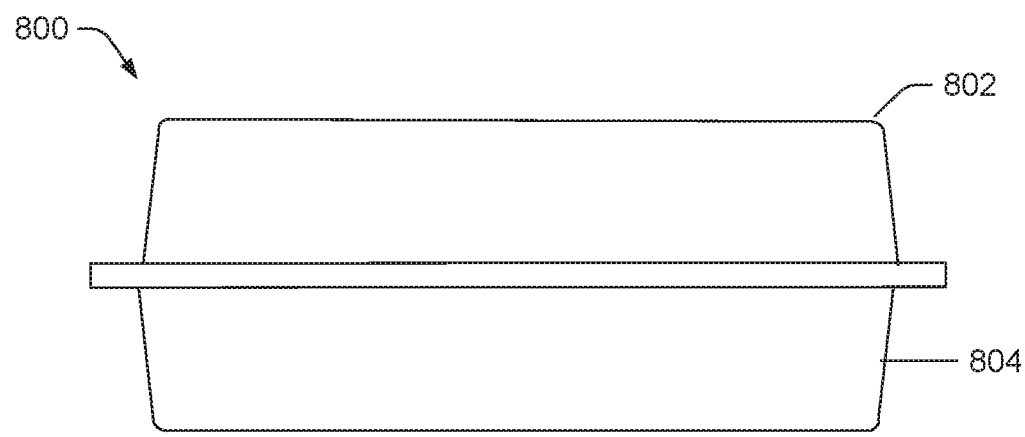
FIG. 8B is a depiction of an example assembled electronic component enclosure and one-piece structural frame in accordance with the present description.

FIG. 8A depicts an example enclosure assembly 800 in accordance with the present description. The example enclosure assembly 800 includes an enclosure top 802, an enclosure bottom 804, and a structural frame 806. The enclosure bottom 804 includes a flange 808 configured to receive the structural frame 806. The structural frame 806 is disposed within the flange 808 of the enclosure bottom 804 and the enclosure top 802 is secured over the enclosure bottom to form an enclosure that is strengthened by the inclusion of the structural frame 806. FIG. 8B shows the example enclosure assembly 800 in a completed state, the enclosure top 802 secured to the enclosure bottom 804.

CONCLUSION

Although the present disclosure has been described in detail, it should be understood that various changes, substitutions and alterations may be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. An enclosure, comprising:
   a first portion having a perimeter;
   a second portion having a perimeter, the second portion joining with the first portion to form a protected space in which electronic components may be disposed;
   an inner channel;
   a one-piece frame disposed in and extending around the perimeter of the first portion or the second portion to provide structural support to the enclosure when the first portion and the second portion are in a joined state, the frame being substantially disposed between the first portion and the second portion when the first portion and the second portion are in a joined state; and
   a component bracket attached to the frame, further comprising one or more flanges partially disposed in the inner channel, the component bracket being positional along the length of the frame by sliding the component bracket flanges along the inner channel of the frame.

2. The enclosure as recited in claim 1, wherein the frame further comprises at least one gasket channel having a gasket disposed therein that communicates with the first portion or the second portion when the first portion and the second portion are in a joined state.

3. The enclosure as recited in claim 1, further comprising one or more electronic components disposed on the component bracket and positionable with the component bracket.

4. The enclosure as recited in claim 1, wherein the frame is disposed in a flange of the first portion or the second portion.

5. A one-piece frame for use with an enclosure for electronic components, comprising:
- a first end;
- a second end;
- an inside edge;
- an outside edge;
- a top gasket channel;
- a top gasket disposed in the top gasket channel;
- a plurality of cutouts extending from an inside edge toward the outside edge;
- wherein deforming the frame so that the first end abuts the second end causes a span of each cutout to substantially close to form a substantially rectangular-shaped frame.

6. A one-piece frame for use with an enclosure for electronic components, comprising:
- a first end;
- a second end;
- an inside edge;
- an outside edge;
- a bottom gasket channel;
- a bottom gasket disposed in the top gasket channel;
- a plurality of cutouts extending from an inside edge toward the outside edge;
- wherein deforming the frame so that the first end abuts the second end causes a span of each cutout to substantially close to form a substantially rectangular-shaped frame.

7. A one-piece frame for use with an enclosure for electronic components, comprising:
- a first end;
- a second end;
- an inside edge;
- an outside edge;
- an outside channel formed in the outside edge;
- a plurality of cutouts extending from an inside edge toward the outside edge;
- wherein deforming the frame so that the first end abuts the second end causes a span of each cutout to substantially close to form a substantially rectangular-shaped frame.

8. The one-piece frame as recited in claim 7, further comprising a connector disposed in the outside channel and spanning the first end and the second end.

9. A one-piece frame for use with an enclosure for electronic components, comprising:
- a first end;
- a second end;
- an inside edge;
- an inside channel;
- an outside edge;
- a bottom gasket channel;
- a bottom gasket disposed in the top gasket channel;
- a plurality of cutouts extending from an inside edge toward the outside edge;
- wherein deforming the frame so that the first end abuts the second end causes a span of each cutout to substantially close to form a substantially rectangular-shaped frame.

10. The one-piece frame as recited in claim 9, further comprising a bracket having one or more flanges disposed in the inside channel so that the bracket is moveable along a length of the inside channel.

\* \* \* \* \*